(12) United States Patent
Ho et al.

(10) Patent No.: US 8,345,462 B2
(45) Date of Patent: Jan. 1, 2013

(54) RESISTIVE MEMORY AND METHOD FOR MANUFACTURING THE SAME

(75) Inventors: Chia-Hua Ho, Hsinchu County (TW); Erh-Kun Lai, Taichung County (TW)

(73) Assignee: Macronix International Co., Ltd., Hsinchu (TW)

( * ) Notice: Subject to any disclaimer, the term of this patent is extended or adjusted under 35 U.S.C. 154(b) by 1071 days.

(21) Appl. No.: 11/950,485

(22) Filed: Dec. 5, 2007

(65) Prior Publication Data
US 2009/0146125 A1 Jun. 11, 2009

(51) Int. Cl.
*G11C 11/00* (2006.01)

(52) U.S. Cl. .................. 365/148; 365/163; 365/158

(58) Field of Classification Search ........... 257/E21.006, 257/E21.52, 2–5, 9, 296, 310, E31.047, E27.006; 438/102, 103, 104, 482, 697, 725, 29, 95, 438/96, 166, 259, 365, 486, 597; 365/46, 365/94, 100, 113, 129, 148, 151, 163; 977/754
See application file for complete search history.

(56) References Cited

U.S. PATENT DOCUMENTS

| | | | |
|---|---|---|---|
| 6,420,097 B1 | 7/2002 | Pike et al. | |
| 6,630,361 B1 * | 10/2003 | Singh et al. | 438/7 |
| 2004/0159828 A1 | 8/2004 | Rinerson et al. | |
| 2005/0151277 A1 * | 7/2005 | Kawazoe et al. | 257/904 |
| 2005/0162881 A1 * | 7/2005 | Stasiak et al. | 365/63 |
| 2006/0043595 A1 | 3/2006 | Aratani et al. | |
| 2006/0154417 A1 * | 7/2006 | Shinmura et al. | 438/240 |
| 2007/0114587 A1 | 5/2007 | Seo et al. | |

FOREIGN PATENT DOCUMENTS

| | | |
|---|---|---|
| CN | 1574363 | 2/2005 |
| CN | 101079395 | 11/2007 |

OTHER PUBLICATIONS

Courtade et al., Microstructure and resistance switching in NiO binary oxideeilms obtained from Ni oxidation, Non-Volatile Memory Technology Symposium, 2006, pp. 94-99.*
English language translation of abstract of CN 1574363 (published Feb. 2, 2005).
Chinese language office action dated Nov. 23, 2011.
English language translation of abstract of CN 101079395 (published Nov. 28, 2007).

* cited by examiner

*Primary Examiner* — Harry W Byrne
(74) *Attorney, Agent, or Firm* — McClure, Qualey & Rodack LLP (57) ABSTRACT

A method for manufacturing resistive memory includes depositing a first conductive material layer on a substrate; etching the first conductive material layer to form a first signal line with a first surface; forming a memory material layer with a second surface coupled to the first signal line via the second surface contacting the first surface; depositing a second conductive material layer coupled to the memory material layer; etching the second conductive material layer to form a second signal line, wherein the area of the second surface is substantially larger or equal to the area of the overlapping region of the first signal line and the second signal line.

18 Claims, 12 Drawing Sheets

RESISTIVE MEMORY AND METHOD FOR MANUFACTURING THE SAME

BACKGROUND OF THE INVENTION

1. Field of the Invention

The invention relates in general to a resistive memory and a method for manufacturing the same, and more particularly to a resistive memory with high scalability and a method for manufacturing the same.

2. Description of the Related Art

While the conventional memory structure has a choke point in improving scalability, the resistive memory has been developed to have high scalability and a high speed in reading/writing and can be manufactured in a metal oxide semiconductor (MOS) process. Therefore, the resistive memory has a great potential in development of new-generation memory technology.

In the present method for manufacturing the resistive memory, after each layer of material is deposited, a photomask with an independent island structure is etched to form an independent memory structure in a lithography process. However, the resolution of the island structure is difficult to increase in the lithography process, which leads to great difficulty in improving device density of the memory.

SUMMARY OF THE INVENTION

The invention is directed to a resistive memory and a method for manufacturing the same. The memory is manufactured by forming line patterns in order to increase device density of the memory.

According to the present invention, a resistive memory is provided. The resistive memory includes a substrate, a first signal line, a memory cell and a second signal line. The first signal line is disposed on the substrate and has a first surface. The memory cell has a second surface, and the memory cell is coupled to the first signal via the first surface contacting the second surface. The second signal line is disposed on the memory cell and is coupled thereto. The area of the second surface is substantially larger or equal to the area of the overlapping region of the first signal line and the second signal line.

According to the present invention, a method for manufacturing resistive memory is provided. The method comprises depositing a first conductive material layer on a substrate; etching the first conductive material layer to form a first signal line; forming a memory material layer coupled to the first signal line; depositing a second conductive material layer coupled to the memory material layer; etching the second conductive material layer to form a second signal line, wherein the area of the second surface is substantially larger or equal to the area of the overlapping region of the first signal line and the second signal line.

The invention will become apparent from the following detailed description of the preferred but non-limiting embodiments. The following description is made with reference to the accompanying drawings.

BRIEF DESCRIPTION OF THE DRAWINGS

FIGS. 1A~8A are top views of the resistive memory in the manufacturing process.

FIGS. 1B~8B are respectively cross-sectional diagrams of the resistive memory in FIGS. 1A~8A along a line AA'.

FIGS. 1C~8C are respectively cross-sectional diagrams of the resistive memory in FIGS. 1A~8A along a line BB'.

DETAILED DESCRIPTION OF THE INVENTION

Figure 1A:
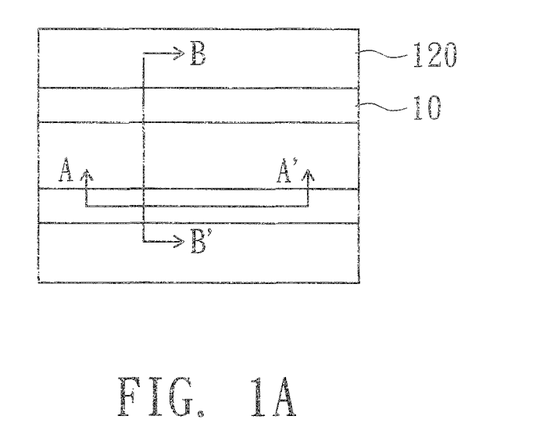
Figure 1B:
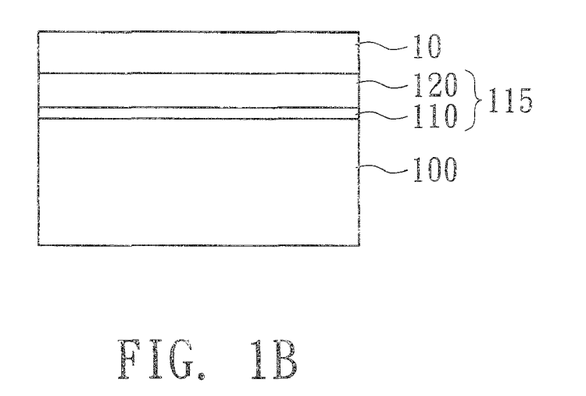
Figure 1C:
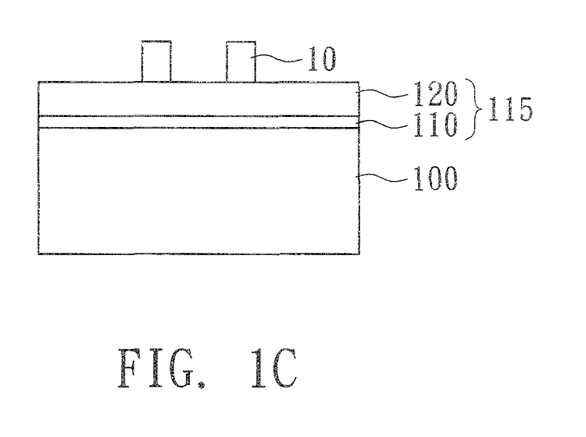
Figure 10A:
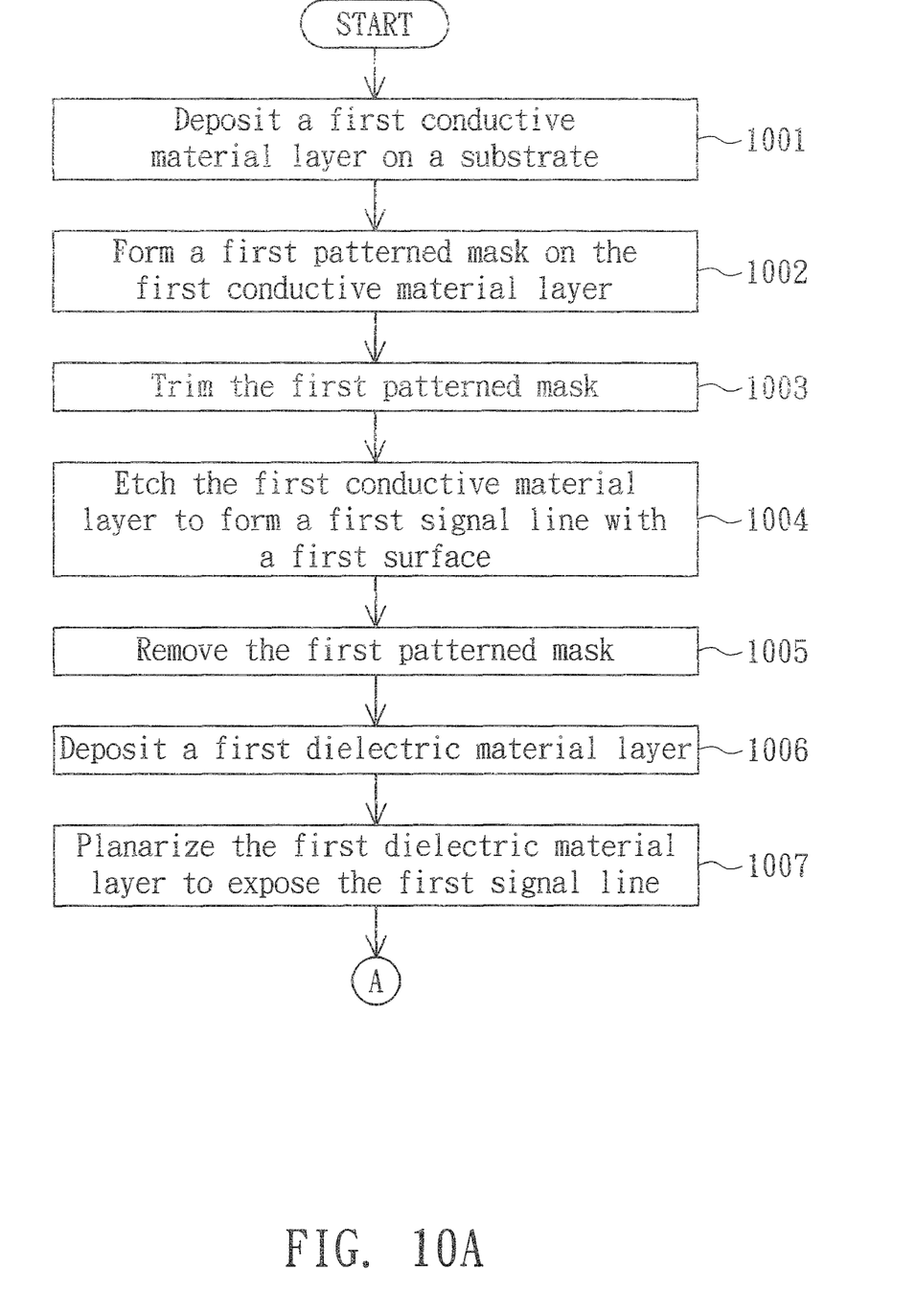
FIG. 10A-10B is a flow chart of a method for manufacturing the resistive memory.
Figure 10B:
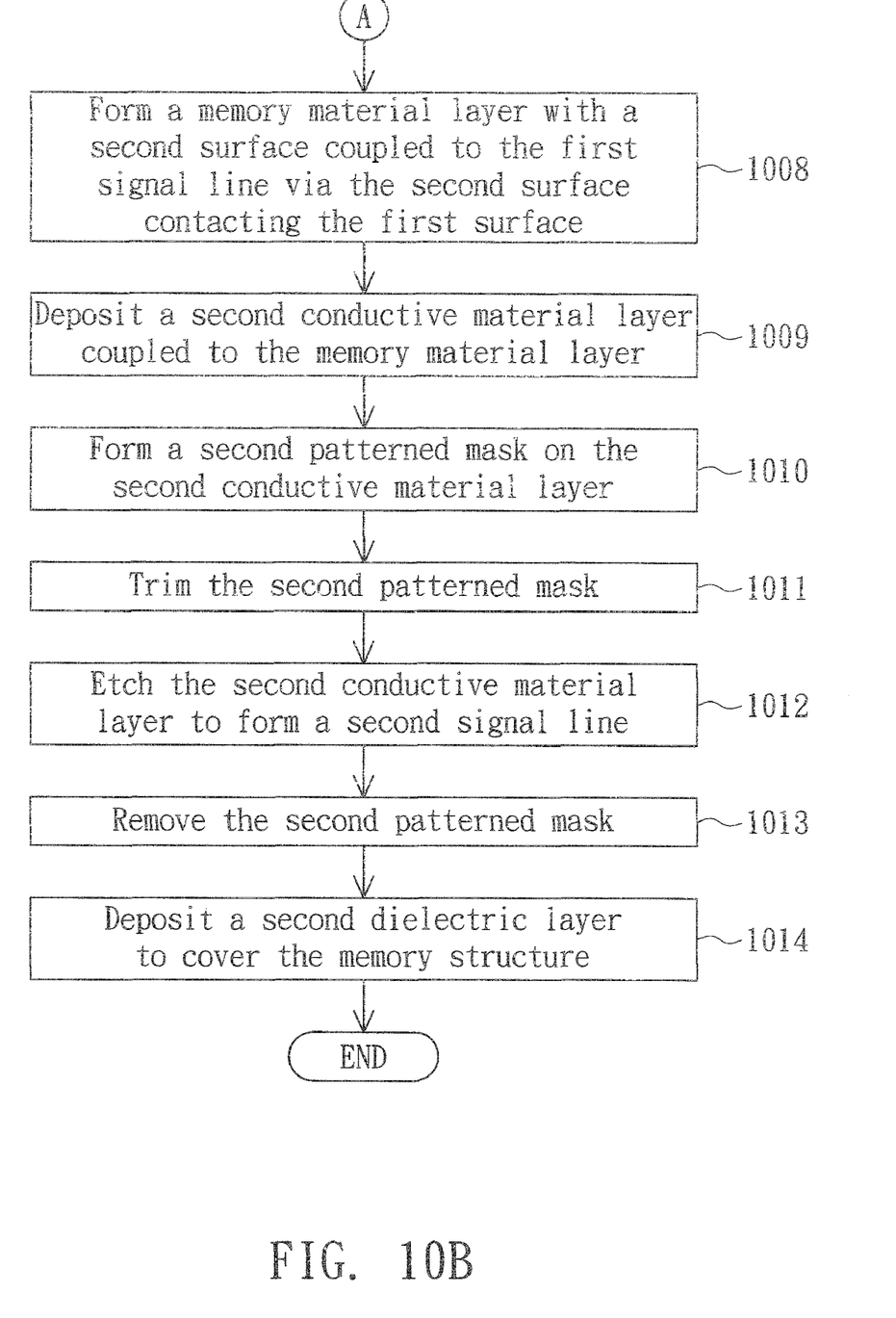

The invention provides a resistive memory and a method for manufacturing the same. The resistive memory including a resistive random access memory (RRAM) and resistive read only memory (RROM). FIGS. 1A~8A are top views of the resistive memory in the manufacturing process. FIGS. 1B~8B are respectively cross-sectional diagrams of the resistive memory in FIGS. 1A~8A along a line AA'. FIGS. 1C~8C are respectively cross-sectional diagrams of the resistive memory in FIGS. 1A~8A along a line BB'. FIG. 10A-10B is a flow chart of a method for manufacturing the resistive memory. Referring to FIGS. 1A, 1B and 1C, first, in step 1001, a first conductive material layer 115 is deposited on the substrate 100. A selective device, such as a metal oxide semiconductor field effect transistor (MOSFET), a diode or a bipolar junction transistor (BJT) can be formed on the substrate 100 beforehand to be coupled with the memory structure for controlling the operation of the memory and a passivation covering selective device is formed, the material of the passivation may be a titanium nitride (TiN) or tantalum nitride (TaN), for example. Besides, in the step 1001, a first barrier material layer 110 which is conductive can be deposited on the substrate 100 first and then a first metal material layer 120 is deposited on the first barrier material layer 110 to form a first conductive material layer 115. The first metal material layer 120 is such as tungsten (W), titanium (Ti), aluminum (Al), nickel (Ni), copper (Cu), zirconium (Zr) or zinc (Zn). In the present embodiment, the material of the first metal material layer 120 is tungsten. The first barrier material layer 110 of the present embodiment is a titanium nitride (TiN) and can be used as an adhesion layer for coupling the first metal material layer 120 with the substrate 100 in order to prevent the first metal material layer 120 from cracking. Following that, in step 1002, a first patterned mask 10 is formed on the first conductive material layer 115. In the present embodiment, the step 1002 can be performed by forming a photoresist material layer (not shown in the figure) on the first conductive material layer 115 first and then the photoresist material layer is patterned to be the first patterned mask 10 in a lithography process. From FIG. 1A, it can be seen that the first patterned mask 10 has a number of first line patterns.

Figure 2A:
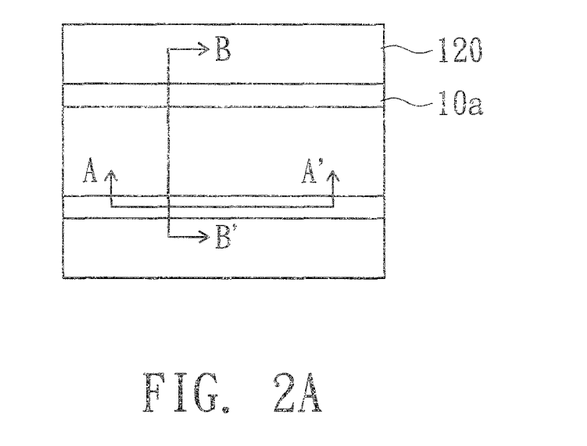
Figure 2B:
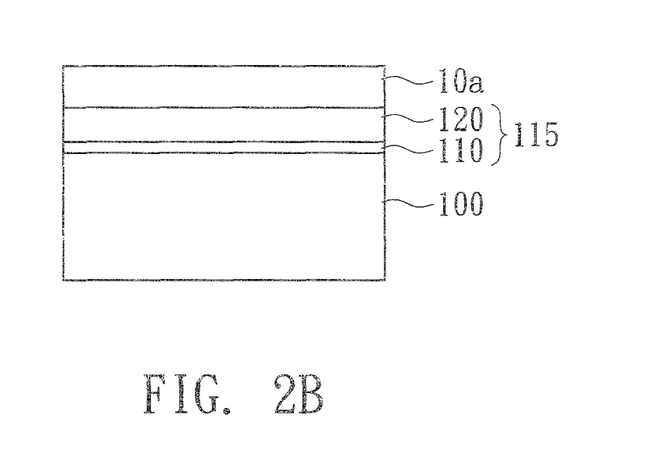
Figure 2C:
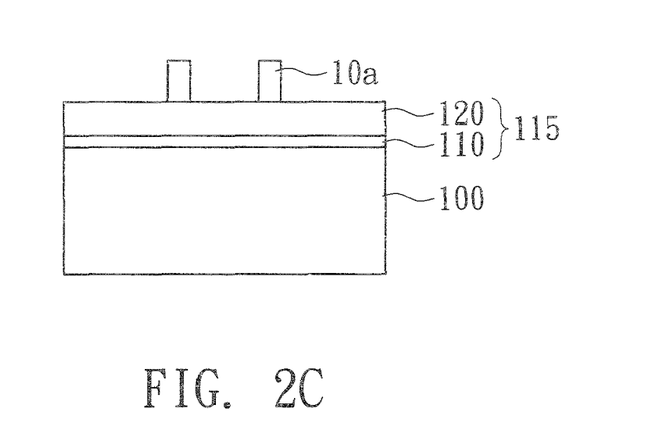

Referring to FIGS. 2A, 2B and 2C, in step 1003, the first patterned mask 10 is trimmed to be a first patterned mask 10*a*. The step 1003 is performed to reduce line-width of the pattern to form a smaller device. The step 1003 can be performed under one or more of chlorine gas (Cl$_2$), bromic acid (Hbr), oxygen gas and argon (Ar) gas mixing with other chemicals by reactive ion etching (RIE). An experiment result shows by using the above method, the line-width of the pattern can be reduced from 60 nm to 20 nm. However, if the exposing machine has the ability for producing the desired line-width that can be achieved in the step 1002, and the step 1003 can be neglected.

Figure 3A:
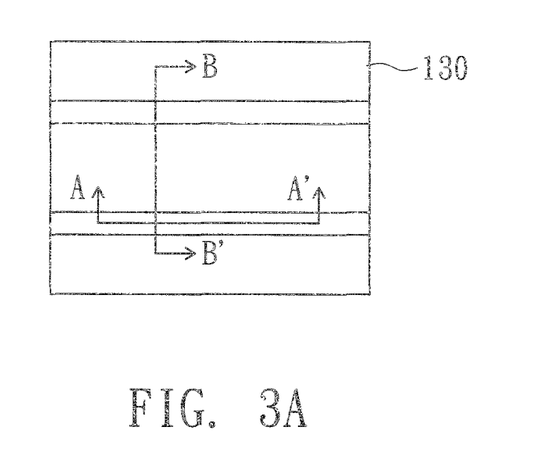
Figure 3B:
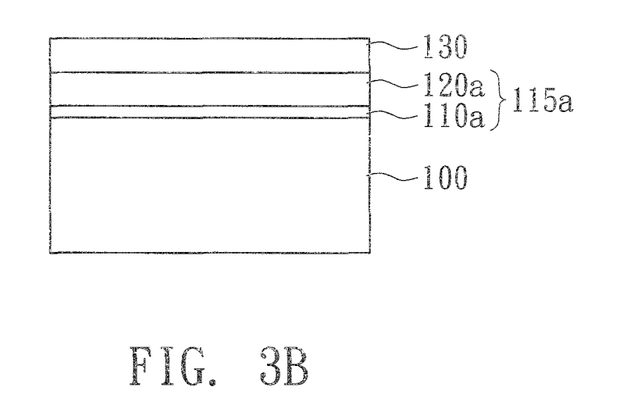
Figure 3C:
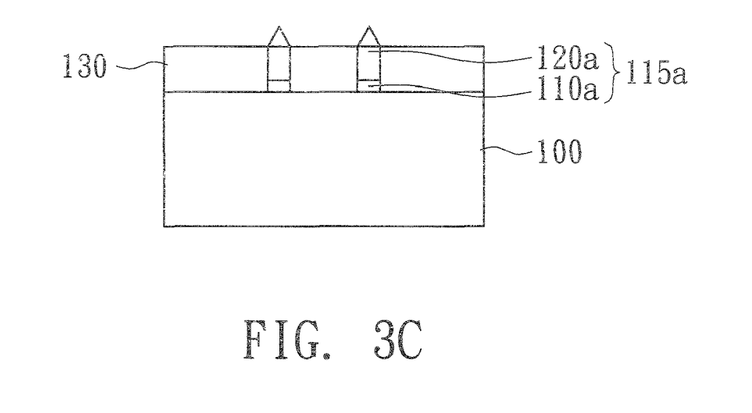

Referring to FIGS. 3A, 3B and 3C, first, in step 1004, the first conductive material layer 115 is etched to be a first signal line 115a. That is, the first metal material 120 is etched to be a first metal layer 120a and the first barrier material layer 110 is etched to be the first barrier layer 110a. Following that, in step 1005, the first patterned mask 10a is removed. The photoresist is removed by oxygen ($O_2$) plasma and then is cleaned by suitable chemistries such as EKC265. Then, in step 1006, a first dielectric material layer 130 is deposited to cover the first signal line 115a and the substrate 100. The step 1006 can be implemented by depositing silicon oxide through high density plasma chemical vapor deposition (HDPCVD).

Figure 4A:
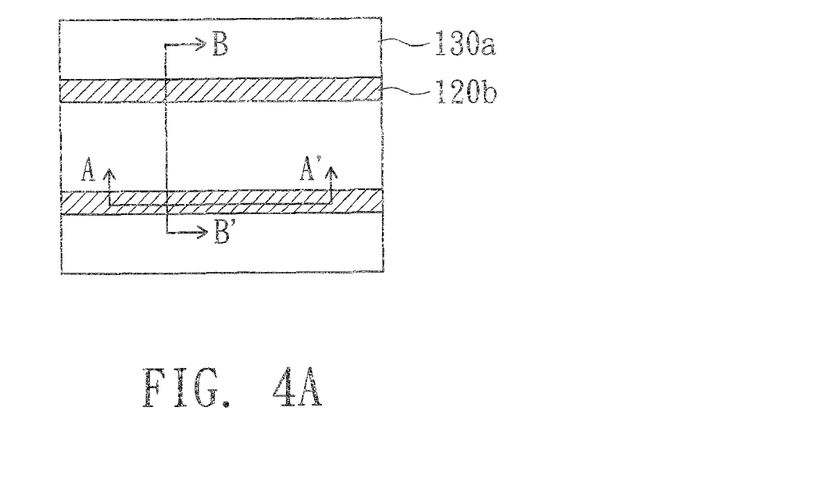
Figure 4B:
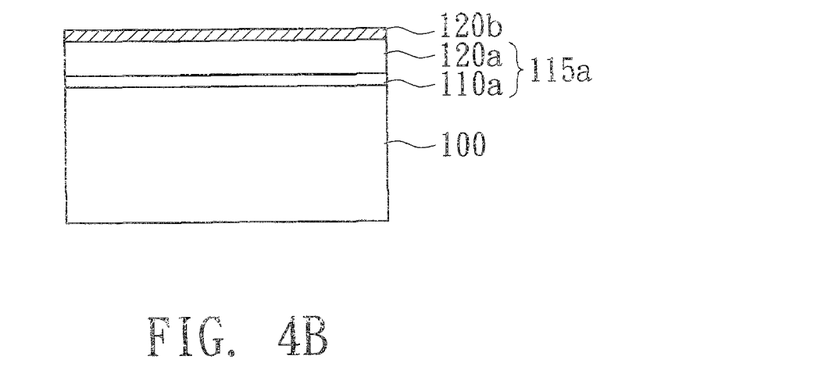
Figure 4C:
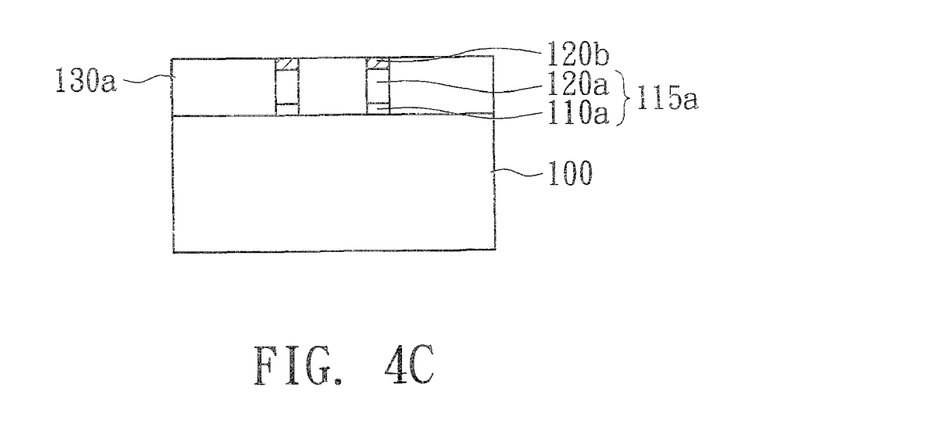

Referring to FIGS. 4A, 4B and 4C, first, in step 1007, the first dielectric material layer 130 is planarized to be a first dielectric layer 130a to expose the first signal line 115a. The step can be performed by chemical mechanical polishing (CMP) or etching back method. Following that, in step 1008, a metal oxide layer 120b, which is a memory material layer, is formed to be coupled to the first signal line 115a. The step 1008 can be implemented by oxidizing a part of the first metal layer 120a under ambient environment of mixture of $O_2$ and $N_2$, or mixture of $O_2$, $N_2$, and $H_2$, or pure $O_2$ in a method of plasma oxidization, such as direct plasma, magnetic field enhance reactive ion plasma or down stream plasma. Owing that the material of the first metal layer 120a of the present embodiment is tungsten, the metal oxide layer 120b formed in the plasma oxidation process is a tungsten oxide.

Figure 5A:
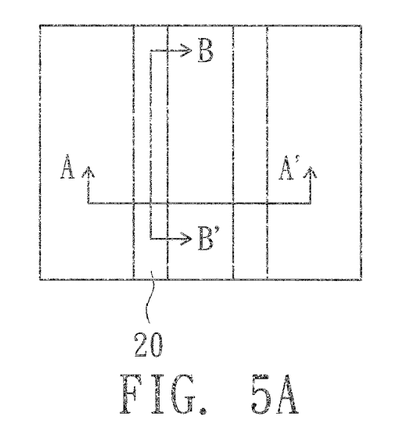
Figure 5B:
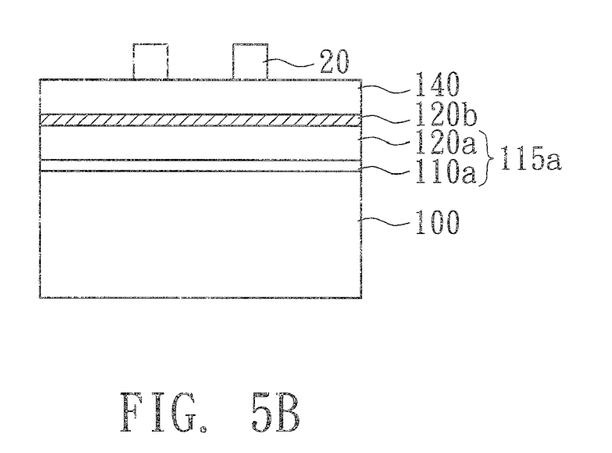
Figure 5C:
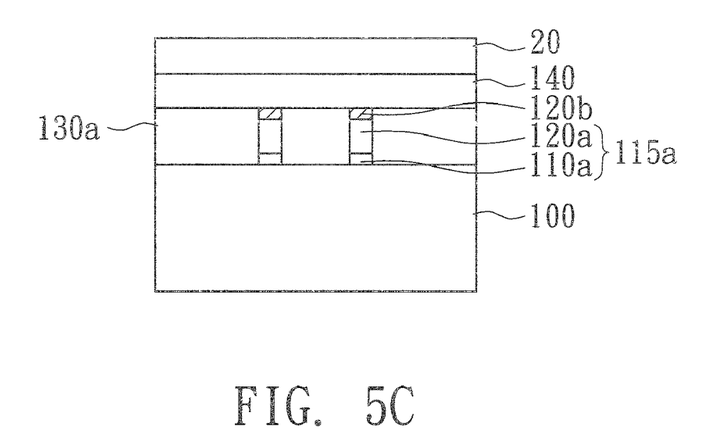

Referring to FIGS. 5A, 5B and 5C, first, in step 1009, the second conductive material layer 140 is deposited to be coupled with the metal oxide layer 120b. Following that, in step 1010, a second patterned mask 20 is formed on the second conductive material layer 140. In the present embodiment, the step 1010 can be performed by forming a photoresist layer (not shown in the figure) on the second conductive material layer 140 and then patterning the photoresist layer to be the second patterned mask 20. From FIG. 5A, it can be seen that the second patterned mask 20 has a number of second line patterns, which are substantially orthogonal to the first line patterns of the first patterned mask 10.

Figure 6A:
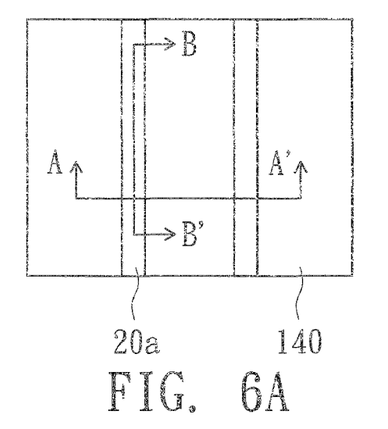
Figure 6B:
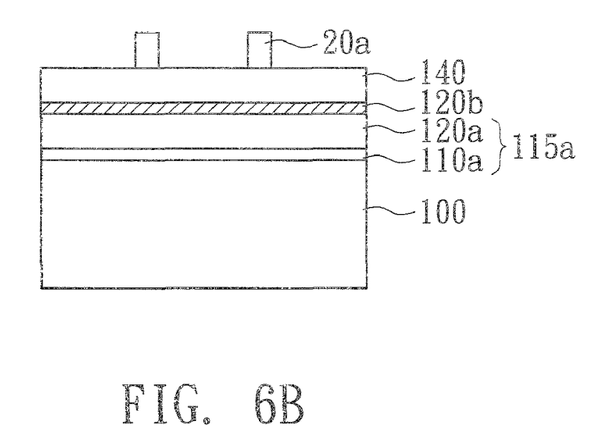
Figure 6C:
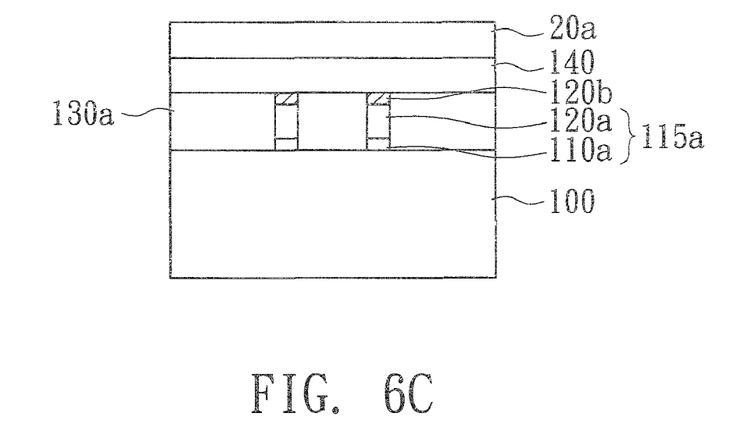

Referring to FIGS. 6A, 6B and 6C, in step 1011, the second patterned mask 20 is trimmed to be a second patterned mask 20a. The step 1011 has the same function as the step 903 to define smaller line-width and produce smaller devices. Similarly, if the exposition machine has enough ability for exposing, the desired line-width that can be achieved in the step 1010, then the step 1011 can then be neglected.

Figure 7A:
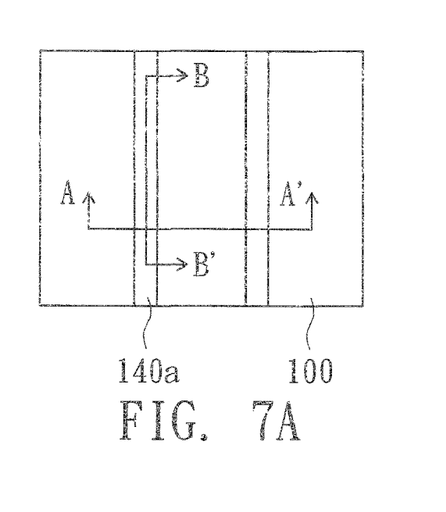
Figure 7B:
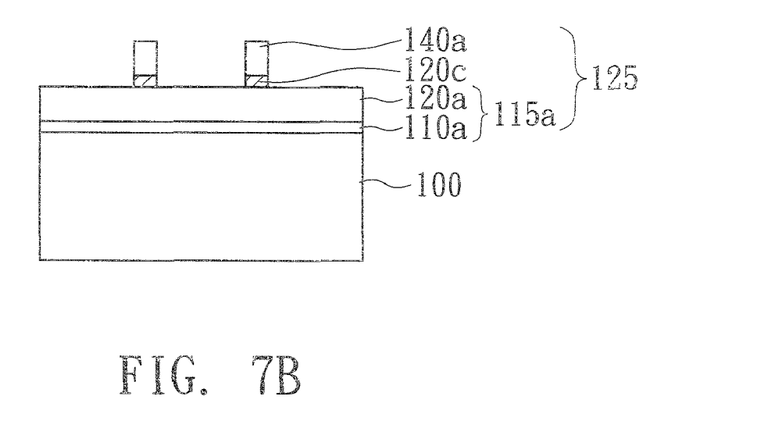
Figure 7C:
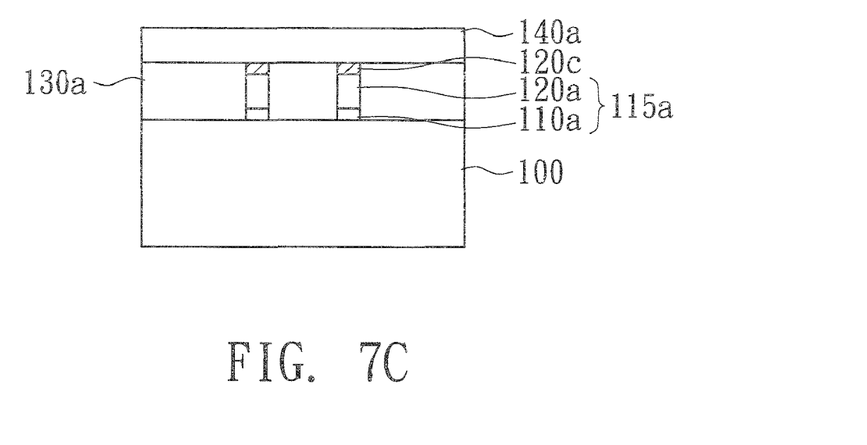

Referring to FIGS. 7A, 7B and 7C, first, in step 1012, the second conductive material layer 140 is etched to form a second signal line 140a, such that a memory structure 125 is formed. The memory structure 125 includes the second signal line 140a, a memory cell 120c and the first signal line 115a. The second conductive material layer 140 can use the same metal material as the first metal material layer 120, and can be etched by using the chemistries such as chlorine gas $Cl_2$ or boron chloride ($BCl_3$). Preferably. In the present embodiment, part of the tungsten oxide of the metal oxide layer 120b is removed by sulfur fluoride ($SF_6$) to define a memory cell 120c together with the second signal line 140a in the etching process. The titanium nitride (TiN) of the first barrier layer 110a can be removed by chlorine-based chemistries. Afterward, in step 1013, the second patterned mask 20a is removed, such as by the same method as the step 1005.

Figure 8A:
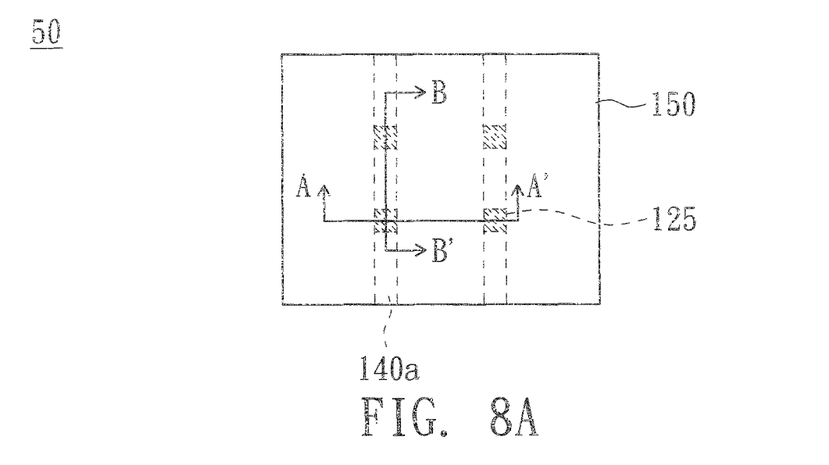
Figure 8B:
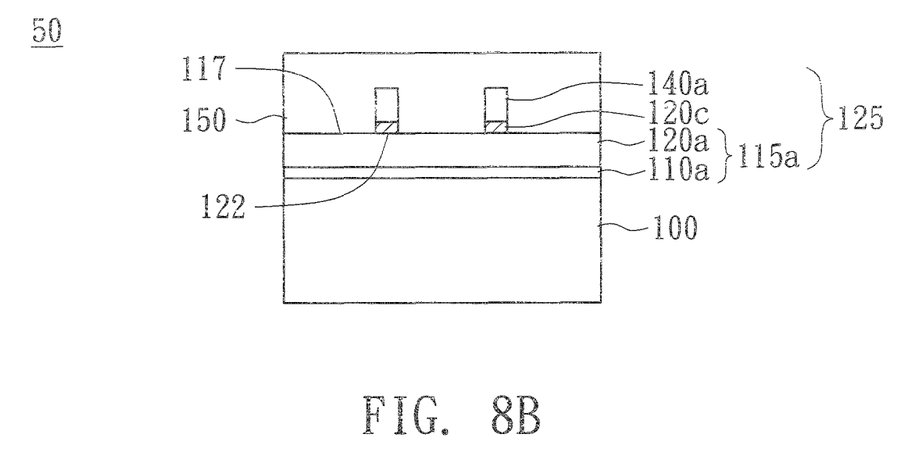
Figure 8C:
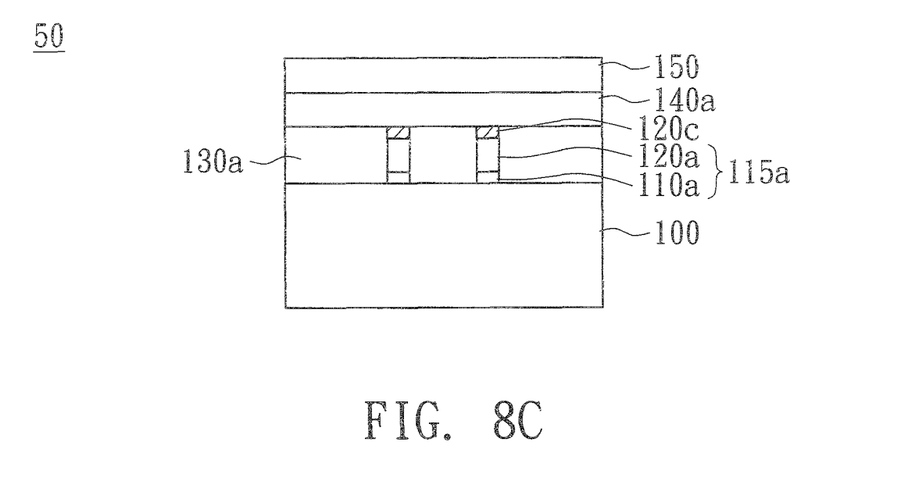

Referring to FIGS. 8A, 8B and 8C, in step 1014, a second dielectric layer 150 is deposited to cover the memory structure 125. The step 1014 can be performed by the same method as the step 1006. Until now, the resistive memory 50 is completed.

As shown in the FIGS. 8A, 8B, and 8C, the resistive memory 50 includes substrate 100, the first signal line 115a, a memory cell 120c, a first dielectric layer 130a, a second signal line 140a and a second dielectric layer 150. The first signal line 115a is disposed on the substrate 100 and has a first surface 117. In the present embodiment, the first signal line 115a is composed of a first barrier layer 110a and a first metal layer 120a, of which titanium oxide and tungsten are respectively used as source material. The memory cell 120c has a second surface 122 and is coupled to the first signal line 115a via the second surface 122 contacting the first surface 117. The material of the memory cell 120c is tungsten oxide in the present embodiment. The second signal line 140a is disposed on the memory cell 120c and is coupled thereto. The second signal lines are bit-lines in the present embodiment. The area of the second surface 122 is substantially equal to the area of the overlapping region of first signal line 115a and the second signal line 140a.

Figure 9A:
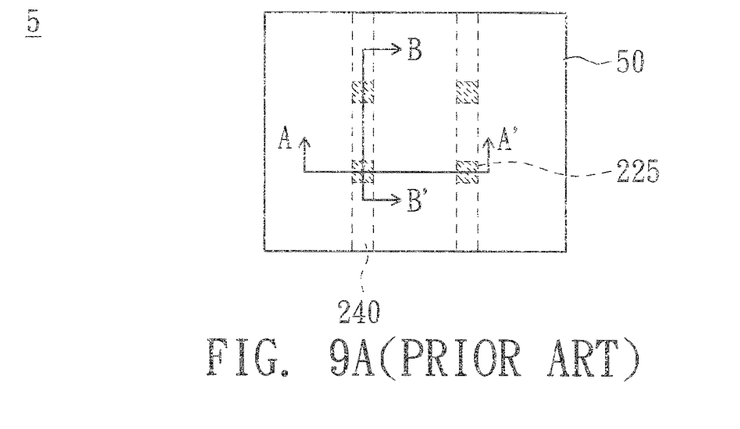
FIG. 9A is a top view of a conventional resistive memory (Prior Art)
Figure 9B:
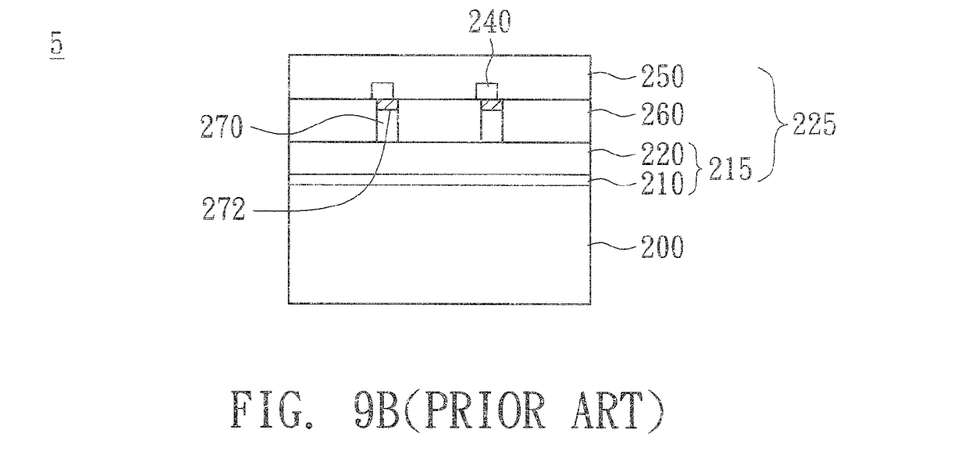
FIG. 9B is a cross-sectional diagram of the resistive memory in FIG. 9A along a line AA (Prior Art)
Figure 9C:
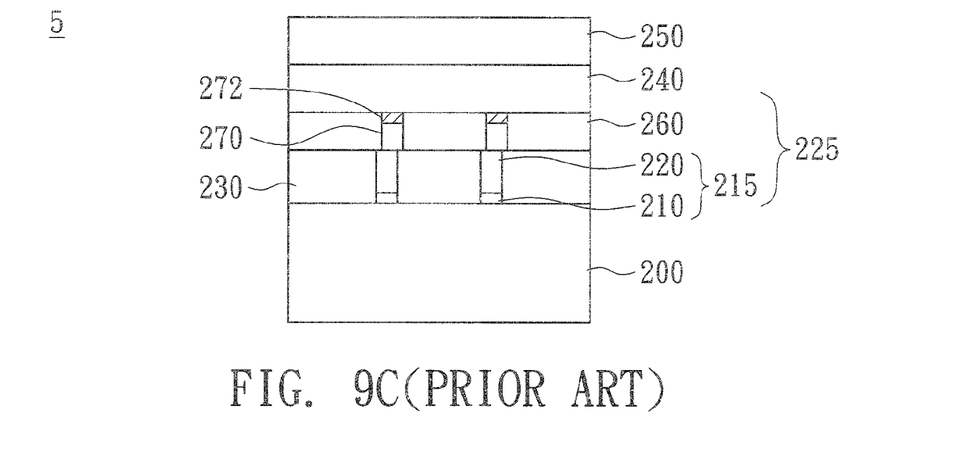
FIG. 9C is a cross-sectional diagram of the resistive memory in FIG. 9A along a line BB' (Prior Art)

Referring to FIGS. 9A, 9B and 9C, a top view a conventional resistive memory, and the cross-sectional diagrams of the resistive memory in FIG. 9A along lines AA' and BB' are shown. The substrate 200, the first signal line 215, the first dielectric layer 230, the second signal line 240 and the second dielectric layer 250 of the resistive memory 5 basically have the same function and structure as the corresponding elements of resistive memory 50, wherein the first signal line 225 includes the first barrier layer 210 and the first metal layer 220. The resistive memory 5 differs from the resistive memory 50 in that a third dielectric layer 260 is used to separate the first signal line 215 and the second signal line 240 and a contact hole 270 is used to couple the same. The memory cell 272 is positioned between the second signal line and the metal layer of the contact hole 270. Due to the isolated island structure of each contact hole, the contact holes are difficult to align the first signal line 215 and the second signal line 240, such that misalignment in the FIGS. 9B and 9C are produced.

Due to line-width reduction, the memory structure 50 can have a smaller cross-sectional area, and the memory cell are defined at the cross sectional area by self-aligning. Besides the signal lines and the memory cell can be aligned precisely, the area of the memory cell can be reduced effectively due to better scalability of line pattern. Not only the device density of the memory can be improved, but also the resistance of the memory cell can be increased due to area reduction in order to largely lower down the programming voltage, leakage current and thus power consumption.

Figure 11A:
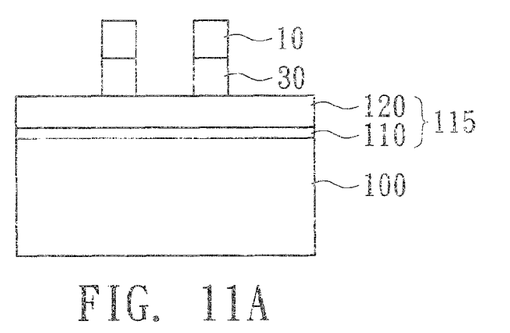
FIGS. 11A and 11B are cross-sectional diagrams for forming another first patterned mask in a manufacturing process of the resistive memory according to the invention.
Figure 11B:
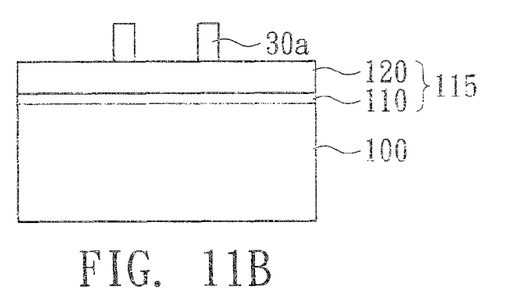

Besides, the steps 1002 and 1003 can be performed by forming a hard mask instead. In the following description, another process for forming the first patterned mask is illustrated accompanied by the cross-sectional diagrams of the memory structure in FIGS. 1A and 2A along the line BB'. Referring to FIGS. 11A and 11B, cross-sectional diagrams for forming another first patterned mask in a manufacturing process of the resistive memory according to the invention are shown. First, a hard mask material layer (not shown in the figure) is formed on the first conductive material layer 115. Following that, a photoresist material layer (not shown in the figure) is formed on the hard mask material layer. Then, the photoresist material layer is patterned to be the first patterned mask 10 as shown in FIG. 1C. Next, the hard mask material layer is etched to be a first patterned hard mask 30 as shown in FIG. 11A. Afterward, the first patterned mask (photoresist layer) 10 is removed and the first patterned hard mask 30 is trimmed to be a first patterned hard mask 30*a* as shown in FIG. 11B. The hard mask material layer can be a nitride such as silicon nitride or an oxide such as silicon oxide and can be trimmed by RIE under chemical gases such as one or more of $CF_4$, $CHF_3$, Ar, $C_4F_8$, $C_4F_6$ and $O_2$ mixture. Or when silicon oxide is used to form the hard mask, dilute hydrofluoric acid (DHF) or buffer hydrofluoric acid (BHF) can be used to for trimming in wet etching. When silicon nitride is used to form the hard mask, hot phosphoric acid can be used for trimming in wet etching. No matter which etching chemical is used, it should be noted the selectivity lest the metal material at the bottom is damaged. The hard mask can be used to increase resistibility for the RIE and ensure an accurate pattern can be formed in the following etching step. Then, the step 1004 can continually proceed.

Figure 12A:
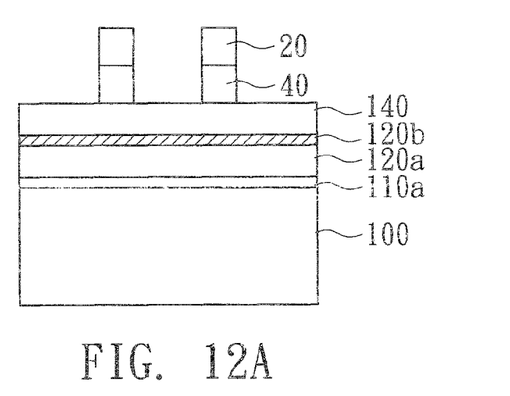
FIGS. 12A and 12B are cross-sectional diagrams for forming another second patterned mask in a manufacturing process of the resistive memory according to the invention.
Figure 12B:
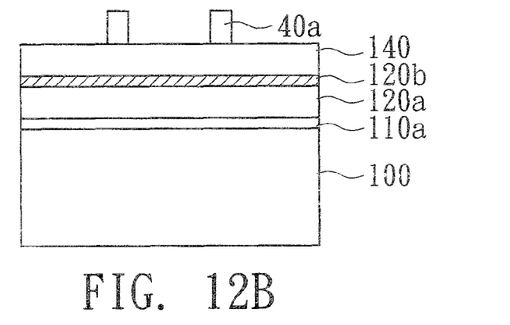

Similarly, the steps 1010 and 1011 can be performed by forming a hard mask instead. In the following description, another process for forming the second patterned mask is illustrated accompanied by the cross-sectional diagrams of the memory structure in FIGS. 5A and 6A along the line AA'. Referring to FIGS. 12A and 12B, cross-sectional diagrams for forming another second patterned mask in a manufacturing process of the resistive memory according to the invention are shown. First, a hard mask material layer (not shown in the figure) is formed on the second conductive material layer 140. Following that, a photoresist material layer (not shown in the figure) is formed on the hard mask material layer. Then, the photoresist material layer is patterned to be the second patterned mask 20 as shown in FIG. 5B. Next, the hard mask material layer is etched to be a second patterned hard mask 40 as shown in FIG. 12A. Afterward, the second patterned mask (photoresist layer) 20 is removed and the second patterned hard mask 40 is trimmed to be a second patterned hard mask 40*a* as shown in FIG. 12B. Then, the step 1012 can continually proceed.

Furthermore, the metal oxide layer 120*b* is not needed to be etched in step 1012, such that the area of the second surface of the memory cell is larger than the area of the overlapping region of the first signal line 115*a* and the second signal line 140*a*. However, as long as the first signal line 115*a* and the second signal line 140*a* is coupled by metal oxide layer 120*b* at the overlapping region, substantial memory cell performing memory function is the portion of the memory cell positioned at the area of the overlapping region of the first signal line 115*a* and the second signal line 140*a*.

The resistive memory and the method for manufacturing disclosed by the above embodiment of the invention generates an independent memory structure by using line patterns, which can improve device scalability and produce a memory of higher density as compared to the prior-art method using island patterns. Besides, the trimmed resistive memory cell can have advantages of low programming voltage, low leakage current and low power consumption, thereby largely increasing practicality and applicability of the resistive memory.

While the invention has been described by way of example and in terms of a preferred embodiment, it is to be understood that the invention is not limited thereto. On the contrary, it is intended to cover various modifications and similar arrangements and procedures, and the scope of the appended claim therefore should be accorded the broadest interpretation so as to encompass all such modifications and similar arrangements and procedures.

What is claimed is:

1. A method for manufacturing resistive memory, comprising:
    (a) depositing a first conductive material layer on a substrate;
    (b) etching the first conductive material layer to form a first signal line with a first surface;
    (c) forming a memory material layer with a second surface coupled to the first signal line via the second surface contacting the first surface;
    (d) depositing a second conductive material layer coupled to the memory material layer; and
    (e) etching the second conductive material layer to form a second signal line, wherein the area of the entire second surface is substantially equal to the area of the overlapping region of the first signal line and the second signal line.

2. The method according to claim 1, wherein the step (a) further comprises the step of forming a first patterned mask having a first line pattern on the first conductive material layer, the step (e) further comprises the step of forming a second patterned mask having a second line pattern on the second conductive material layer, and the first line pattern and the second line pattern are substantially orthogonal to each other.

3. The method according to claim 1, wherein the step (a) comprises:
    depositing a first barrier material layer which is conductive on the substrate; and
    depositing a first metal material layer on the first barrier material layer to form the first conductive material layer.

4. The method according to claim 3, wherein the first barrier material layer is a titanium nitride (TiN).

5. The method according to claim 1, wherein the step (a) further comprises:
    forming a hard mask material layer on the first conductive material layer;
    forming a photoresist material layer on the hard mask material layer;
    patterning the photoresist material layer to form a first patterned photoresist layer;
    etching the hard mask material layer to be the first patterned mask; and
    removing the first patterned photoresist layer.

6. The method according to claim 5, wherein after the step of removing the first patterning photoresist layer further comprises trimming the first patterned mask.

7. The method according to claim 1, wherein the hard mask material layer is a nitride or an oxide.

8. The method according to claim 1, wherein the step (a) comprises:
    forming a photoresist layer on the first conductive material layer; and
    patterning the photoresist layer to be a first patterned mask.

9. The method according to claim 8, wherein after the step of patterning the photoresist layer further comprises trimming the first patterned mask.

10. The method according to claim 1, wherein the step (e) comprises:
    forming a hard mask material layer on the second conductive material layer;
    forming a photoresist material layer on the hard mask material layer;
    patterning the photoresist layer to be a second patterned photoresist layer;
    etching the hard mask material layer to be the second patterned mask; and
    removing the second patterned photoresist layer.

11. The method according to claim 10, wherein after the step of removing the second patterned photoresist layer further comprises trimming the second patterned mask.

12. The method according to claim 1, wherein the step (e) comprises:

forming a photoresist material layer on the second conductive material layer; and patterning the photoresist material layer to be a second patterned mask.

13. The method according to claim 12, wherein after the step of patterning the photoresist material layer further comprises trimming the second patterned mask.

14. The method according to claim 1, wherein the step (b) further comprises the steps of depositing a first dielectric material layer, and planarizing the first dielectric material layer to expose the first signal line.

15. The method according to claim 14, wherein the step of planarizing is performed be chemical mechanical polishing (CMP).

16. The method according to claim 14, wherein the step of planarizing is performed by etching back.

17. The method according to claim 1, wherein the step (c) comprises oxidizing the first signal line to form the memory material layer.

18. The method according to claim 1, wherein after the step (e) further comprises:

depositing a second dielectric layer to cover the memory structure.

* * * * *